United States Patent [19]
Savage

[11] Patent Number: 5,513,189
[45] Date of Patent: Apr. 30, 1996

[54] BOUNDARY SCAN SYSTEM WITH IMPROVED ERROR REPORTING USING SENTINEL BIT PATTERNS

[75] Inventor: Thomas W. Savage, San Jose, Calif.

[73] Assignee: Tandem Computers, Incorporated, Cupertino, Calif.

[21] Appl. No.: 248,801

[22] Filed: May 25, 1994

[51] Int. Cl.⁶ .................................... G01R 31/3183
[52] U.S. Cl. .................. 371/22.3; 371/49.2; 371/53; 371/57.2
[58] Field of Search .................. 371/22.3, 49.2, 371/53, 57.2; 324/73.1

[56] References Cited

U.S. PATENT DOCUMENTS

| | | | |
|---|---|---|---|
| 4,149,038 | 4/1979 | Pitroda et al. | 370/14 |
| 5,109,381 | 4/1992 | Duxbury et al. | 371/16.5 |
| 5,155,732 | 10/1992 | Jarwala et al. | 371/22.3 |
| 5,168,499 | 12/1992 | Peterson et al. | 371/11.3 |
| 5,173,905 | 12/1992 | Parkinson et al. | 371/40.1 |
| 5,303,246 | 4/1994 | Anderson et al. | 371/22.3 |
| 5,331,274 | 7/1994 | Jarwala et al. | 324/158.1 |
| 5,390,351 | 2/1995 | Di Giulio et al. | 395/725 |

*Primary Examiner*—Ellis B. Ramirez
*Assistant Examiner*—Kyle J. Choi
*Attorney, Agent, or Firm*—Graham & James

[57] ABSTRACT

A boundary scan bus error reporting circuitry loads an unused sentinel bit pattern into the boundary scan instruction register in a conventional error reporting boundary scan test system. The unused sentinel bit pattern signifies that a fault exists somewhere upstream of the instruction register in the boundary scan circuitry associated with a specific integrated circuit. The special sentinel pattern is loaded into the instruction register in response to an illegal instruction control signal generated by an instruction decoder coupled to the instruction latch in the boundary scan architecture.

10 Claims, 2 Drawing Sheets

BOUNDARY SCAN SYSTEM WITH IMPROVED ERROR REPORTING USING SENTINEL BIT PATTERNS

BACKGROUND OF THE INVENTION

This invention relates to integrated circuits incorporating a boundary scan architecture for enabling interconnect and corelogic function testing.

Integrated circuits are increasingly being designed with a boundary scan test capability in order to facilitate the testing of manufactured integrated circuits for proper pin connections and corelogic functionality. In a boundary scan integrated circuit, the corelogic is surrounded by a multiplicity of individual boundary scan cells each coupled between a different device terminal and the corelogic element coupled to that device terminal. The boundary scan cells are all serially connected, and the first and last boundary cells in the chain are coupled, respectively, to the test data input and the test data output of a boundary scan test access port. When the integrated circuit is powered up for normal use, the individual boundary scan cells are transparent. However, when a boundary scan test is being performed, individual ones of the boundary scan cells are activated by means of instructions supplied from an external controller usually termed an initiator. Each instruction is loaded into a boundary scan instruction register and is decoded by a boundary scan decoder element and used to test the integrity of the terminal-to-corelogic individual connections and also the functionality of at least some of the corelogic elements. This boundary scan test is usually performed as part of the manufacturing operation, but is increasingly being used as part of a field service capability. The resultant test data is sent back to the initiator for evaluation. Communication between the boundary scan initiator and the boundary scan test circuits are over a small bus (usually four bits wide) termed a boundary scan bus.

The test access port of the boundary scan architecture typically includes a test data input, a test data output, a test clock input and a test mode select input. Input test data, such as boundary scan test instructions, are serially clocked into the boundary scan instruction register by means of the test clock signal and the mode of operation of the boundary scan circuitry is controlled by the test mode select control signal.

When testing a plurality of boundary scan integrated circuits mounted on a single printed circuit board, the boundary scan registers for the individual integrated circuits are either connected in series to form a single boundary scan path through the connection of integrated circuits, or are connected in a parallel arrangement to contain several independent boundary scan paths.

In order to ensure that the boundary scan path itself is functional, the boundary scan circuitry on each integrated circuit is provided with logic circuitry for loading into the boundary scan instruction register a predetermined sentinel bit pattern downstream of an incoming instruction. As the instruction is serially shifted into the instruction register, the sentinel bit pattern is shifted out to the test data output terminal of the test access port, and is coupled to the boundary scan initiator. If the sentinel bit pattern is correct, this verifies the integrity of the boundary scan paths. If not, a discontinuity somewhere along the boundary scan path is indicated. In the case of several integrated circuits each incorporating boundary scan architecture and linked to the boundary scan bus in series, the sentinel bits corresponding to each integrated circuit are checked by the boundary scan initiator to test for boundary scan bus continuity.

In known devices, this sentinel protocol is incapable of indicating whether the boundary scan bus discontinuity exists upstream of the instruction register or downstream of the instruction register. This inability to isolate the location of the fault complicates the task of repairing a fault in the boundary scan bus.

SUMMARY OF THE INVENTION

The invention comprises a method and apparatus for indicating whether a boundary scan bus fault has occurred downstream of the instruction register or upstream of the instruction register.

From an apparatus standpoint, the invention represents an improvement in a boundary scan integrated circuit having a plurality of external device terminals, a plurality of corelogic elements, a plurality of boundary scan cells coupled to the terminals and the logic elements, a boundary scan test access port, a boundary scan instruction register for receiving instructions from an externally located initiator, and loading means for loading standard sentinel bits into the boundary scan instruction register. According to the invention, the improvement comprises means coupled to the boundary scan instruction register for detecting receipt of an illegal instruction, and means coupled to the loading means and responsive to the detecting means for providing a different sentinel bit pattern to the loading means in response to the detection of an illegal instruction. The providing means preferably includes multiplexer means having a pair of inputs coupled respectively to the sources of the standard sentinel bit pattern and the different sentinel bit pattern.

From a method standpoint, the invention comprises the technique of examining an instruction received in a boundary scan register and testing whether a received instruction is valid or invalid. If valid, the standard sentinel bit pattern is inserted into the instruction register; if invalid, a different sentinel bit pattern is inserted into the instruction register and shifted out to the test data output, thence to the external initiator. Receipt of the standard sentinel bit pattern signifies the integrity of the boundary scan bus. Receipt of the different sentinel bit pattern indicates that the instruction was corrupted somehow prior to being received by the instruction register, i.e., that there is a fault upstream of the instruction register.

For a fuller understanding of the nature and advantages of the invention, reference should be had to the ensuing detailed description taken in conjunction with the accompanying drawings.

DETAILED DESCRIPTION OF THE PREFERRED EMBODIMENTS

Figure 1:
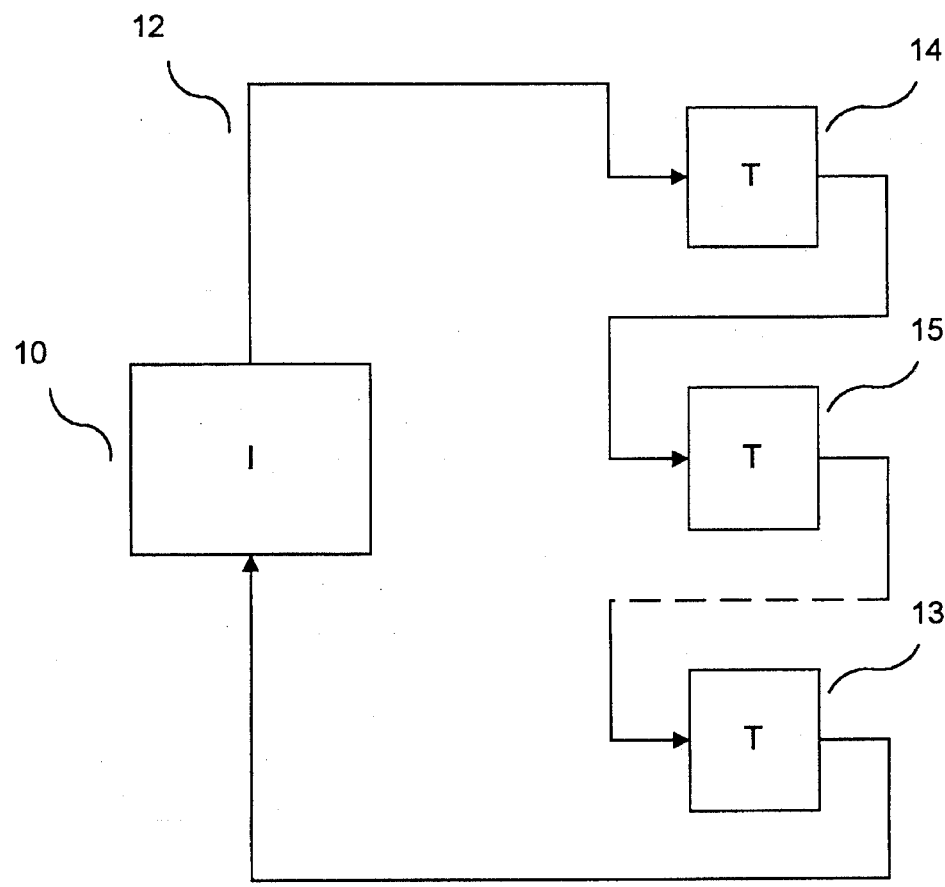
FIG. 1 is a schematic diagram illustrating a typical boundary scan bus implementation with a plurality of integrated circuits.

Turning now to the drawings, FIG. 1 is a generalized block diagram illustrating a plurality of integrated circuits connected to a boundary scan bus. As seen in this figure, an initiator 10, typically a small CPU or intelligent tester circuit, is coupled to a boundary scan bus 12 which is routed to a first integrated circuit 14 incorporating boundary scan test circuitry. The output of the boundary scan circuitry in integrated circuit 14 is coupled to the input of the boundary scan circuitry on a second integrated circuit 15. Integrated circuit 15 is connected to a next integrated circuit in the chain, and the output of the boundary scan circuitry in the last integrated circuit 18 is routed by means of the boundary scan bus back to the initiator 10.

Figure 2:
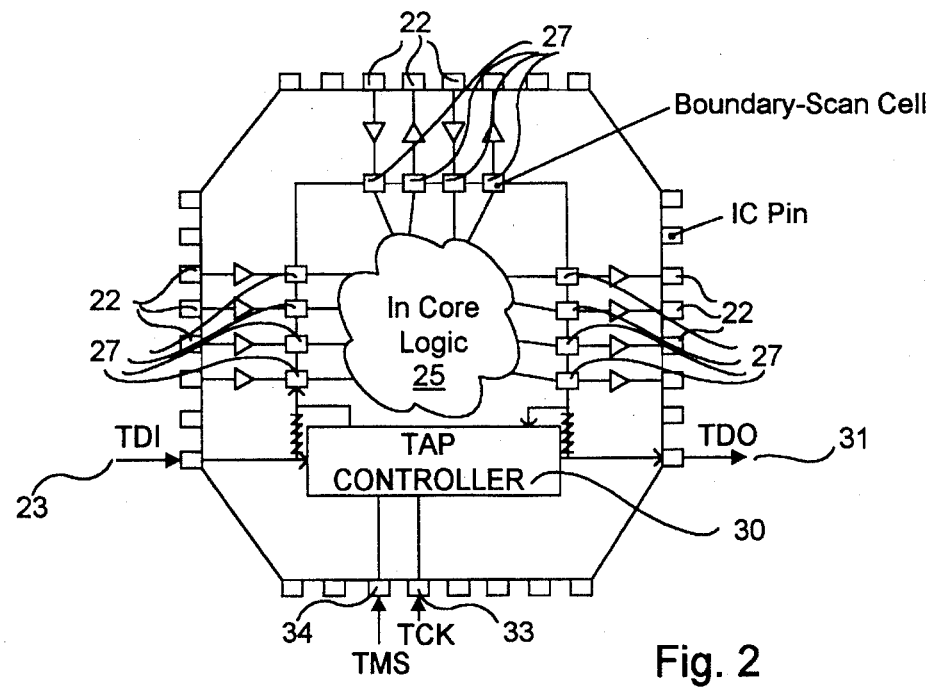
FIG. 2 is a schematic diagram illustrating the arrangement of the boundary scan circuitry on a single integrated circuit.

With reference to FIG. 2, each integrated circuit has a plurality of externally accessible device terminals 22 which are coupled to the core logic generally designated with reference numeral 25 incorporated into the integrated circuit. A multiplicity of boundary scan cells 27 are arranged about the core logic, with each cell being associated with a given terminal 22 and a specific core logic input or output. All boundary cells on a given integrated circuit are connected in series, and each cell comprises a single stage in a multi-stage boundary cell register. The first cell in the array is coupled to the test data input 28 of a test access port 30, and the last cell in the array is coupled to a test data output terminal 31 of the test access port 30. The test data input terminal of the test access port 30 is coupled to the data line in the boundary scan bus 12; while the test data output terminal 31 is coupled to the test data output line in boundary scan bus 12.

The boundary scan bus 12 further includes a test clock line which furnishes clock signals to a test clock input terminal 33 of test access port 30. A test mode status line in boundary bus 12 is coupled to a test mode status terminal 34 in test access port 30. The test clock signals are used to control the operation of data entry and shifting in the boundary scan circuitry, and the test mode status control line is used to control the operation of the individual boundary scan circuits. For a complete discussion of the nature and function of the boundary scan circuitry and the various signals, reference should be made to the publication "IEEE standard test access port and boundary-scan architecture", IEEE STD 1149.1-1990, published by the Institute of Electrical and Electronic Engineers, Inc., of New York, the disclosure of which is hereby incorporated by reference.

Figure 3:
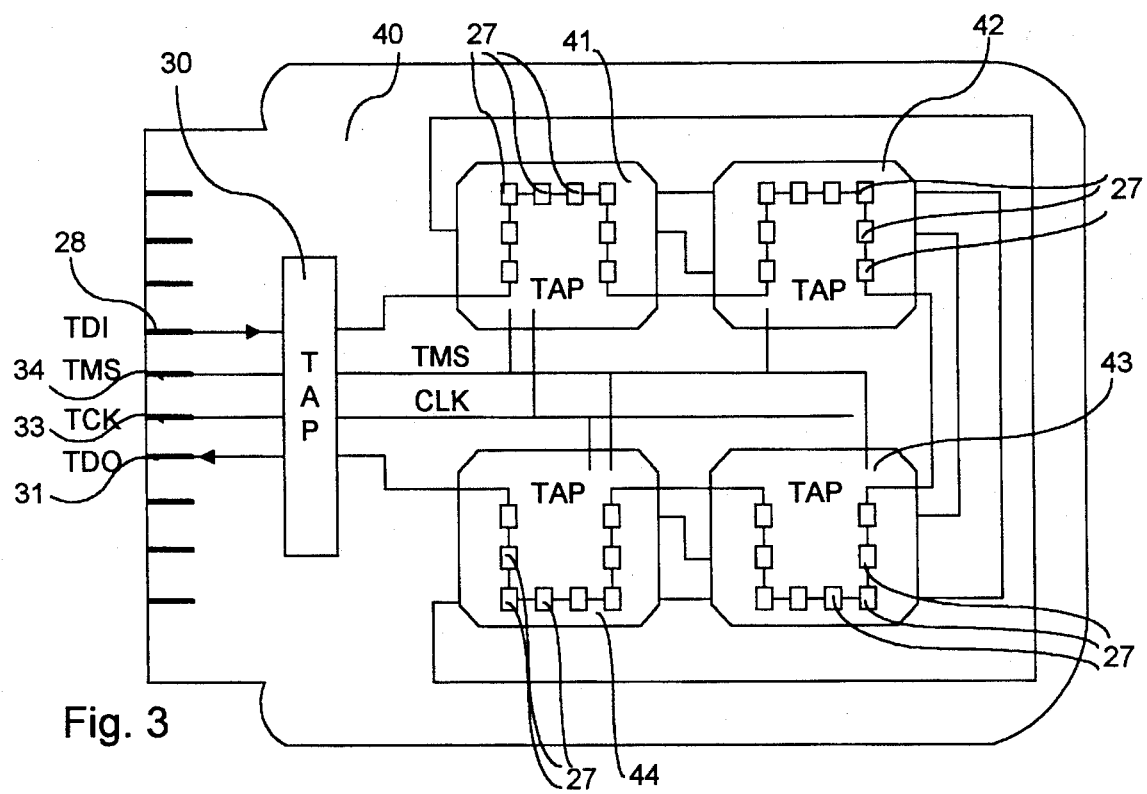
FIG. 3 is an illustration of a plurality of boundary scan integrated circuits mounted on a single printed circuit board with the boundary scan registers connected in series.

FIG. 3 illustrates the manner in which several boundary scan integrated circuits mounted on a single printed circuit PC board can be interconnected in such a manner that the boundary scan circuitry on each chip is operated in serial fashion. As seen in this figure, a single PC board 40 has a plurality of boundary scan integrated circuits 41–44, each having boundary scan cells 27 distributed therein. The test data input 28, test data output 31, test clock 33 and test mode status terminals 34 are all coupled to the test access port 30 as shown, and the test data input signals are routed serially through the boundary cells 27 in each of the four integrated circuits 41–44. The test data output signals from the last boundary cell 27 in integrated circuit 44 are coupled back through the test access port 30 to the test data output terminal 31 and back to the initiator 10 (FIG. 1).

Figure 4:
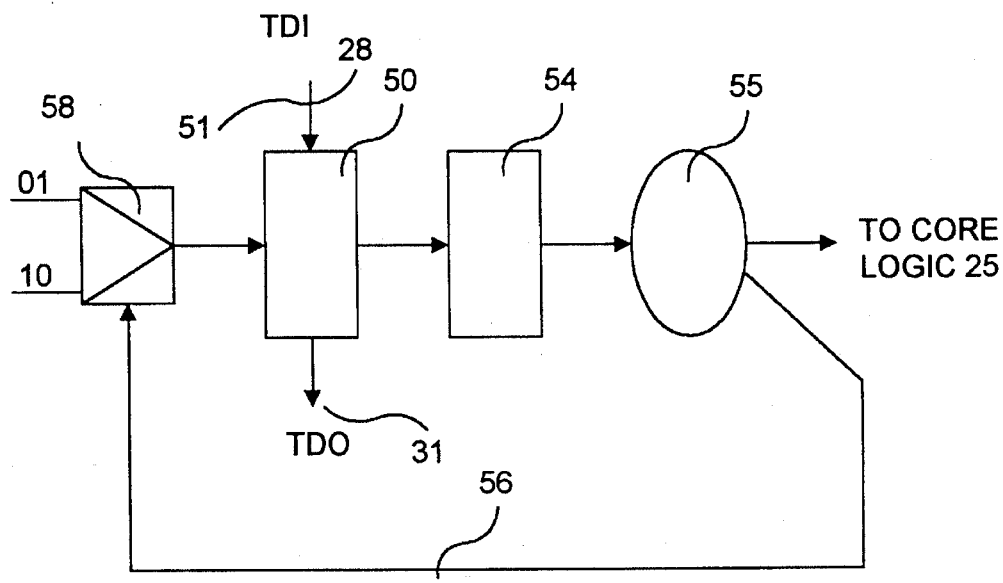
FIG. 4 is a block diagram illustrating the preferred implementation of the invention.

FIG. 4 illustrates a portion of the boundary scan circuitry incorporating the invention. As seen in this figure, the boundary scan instruction register 50 has a serial input terminal 51 which is coupled to the test data input terminal 28 for receiving test instructions to be used in performing the boundary scan test for the core logic in the associated integrated circuit. After a complete instruction is received in register 50, the full instruction is latched in parallel in a latch 54. The instruction stored in latch 54 is coupled to an instruction decoder 55 and thence to various portions of the corelogic 25. The instruction decoder 55 is configured to generate a signal indicating receipt of an illegal instruction, i.e., one which is not to be recognized by the boundary scan circuitry as a legitimate instruction. This is interpreted as a fault somewhere upstream of instruction register 50. The illegal instruction decode signal is fed via a lead 56 to a multiplexer 58 coupled to preselected stages of instruction register 50, typically the last few or least significant bit stages of the register. In the absence of an illegal instruction signal on lead 56, multiplexer 58 normally is enabled to pass a standard "01" sentinel bit pattern to instruction register 50 for loading therein. When an illegal instruction is decoded, however, multiplexer 58 is switched to the opposite configuration in which a different (corrupted) sentinel bit pattern "10" is loaded into instruction register 50. Thereafter, the sentinel bit pattern is clocked out of instruction register 50 to the test data output terminal 31 and thence downstream to either the next serially connected integrated circuit or, if this is the last such integrated circuit to the integrator 10. In either case, once the sentinel bit pattern reaches the initiator 10, it is examined to determine if a standard bit pattern has been received or whether some other pattern has been received.

For a two-bit sentinel bit pattern, there are four possible bit configurations as follows:

| Sentinel | Interpretation |
| --- | --- |
| 00 | Interconnection is stuck low |
| 01 | Interconnection good, no target error exists |
| 10 | Interconnection good, target error exists |
| 11 | Interconnection is stuck high |

The bit pattern "00" indicates that the boundary scan bus is "stuck" at the low logic level somewhere downstream from the output of the instruction register 50. The pattern "01" indicates that the boundary scan bus is not faulty. The "11" pattern indicates that the boundary scan bus is "stuck" at a high logic level downstream from the instruction register 50. The corrupted sentinel pattern "10" indicates that the downstream interconnection from the instruction register 50 is good, but that there is a fault somewhere upstream of the instruction register which corresponds to those two sentinel bits.

The invention can be expanded to use the same "10" bit pattern to signify other errors within the boundary scan circuitry in a given integrated circuit, if desired. For example, a specific fault test could also be used to generate the control signal on lead 56 for operating multiplexer 58. Also, the number of bits in the sentinel bit pattern could be expanded to three or more, if desired, in order to provide more specific fault designation.

While the above provides a full and complete disclosure of the preferred embodiment of the invention, various modifications, alternate constructions and equivalents will occur to those skilled in the art. Therefore, the above description and illustrations should not be construed as limiting the scope of the invention which is defined by the appended claims.

What is claimed is:

1. An integrated circuit, comprising:

a plurality of external device terminals;

a plurality of core logic elements;

a boundary scan test access port;

a boundary scan instruction register, formed of a plurality of boundary scan cells and coupled to said device terminals and said core logic elements, for receiving instructions from an externally located initiator;

said boundary scan test access port including a test data input terminal, a test data output terminal, a test clock terminal and a test mode select terminal;

means coupled to said boundary scan instruction register for detecting receipt of an illegal instruction; and loading means responsive to said detecting means for loading standard sentinel bits into said boundary scan instruction register when no illegal instruction is detected and for loading a different plurality of sentinel bits to said boundary scan instruction register in response to the detection of an illegal instruction.

2. The invention of claim 1 wherein said loading means includes multiplexer means having a pair of inputs coupled, respectively, to a source of said standard sentinel bits and to a source of said different plurality of sentinel bits.

3. An integrated circuit for use in a chained serial bus, comprising:

a plurality of core logic elements;

a boundary scan instruction register connected to at least one of the plurality of core logic elements;

a test data in terminal for inputting an instruction into the boundary scan instruction register;

a decoder for detecting an error in the instruction in the boundary scan instruction register and for outputting a signal indicating that the error was detected; and means, responsive to the signal output from the decoder, for loading a first predetermined pattern of sentinel bits into the boundary scan instruction register when no error is detected by the decoder and for loading a second predetermined pattern of sentinel bits into the boundary scan instruction register when an error is detected by the decoder.

4. The integrated circuit of claim 3, further comprising means for outputting data in the boundary scan instruction register, including the sentinel bits, from the integrated circuit.

5. The integrated circuit of claim 3, wherein the contents of the first and second predetermined pattern of sentinel bits indicate a first and a second error condition, respectively.

6. The integrated circuit of claim 3, wherein the location of the sentinel bits within the boundary scan instruction register indicates that the error has occurred within the integrated circuit and, wherein other integrated circuits in the chained serial bus indicate errors by replacing different portions of the sentinel bits.

7. A method for indicating an error upstream of an integrated circuit in a serial bus, comprising the steps of;

inputting an instruction to a boundary scan instruction register;

examining the instruction to determine if the instruction is valid or invalid;

inserting a first predetermined sentinel bit pattern in a portion of the boundary scan instruction register when the instruction is valid; and inserting a second predetermined sentinel bit pattern in the portion of the boundary scan instruction register when the instruction is invalid.

8. The method of claim 7, further including the step of outputting data, including the sentinel bits, in the boundary scan instruction register from the integrated circuit.

9. The method of claim 8, further including the step of determining that an error occurred upstream of the boundary scan instruction register when the sentinel bits include the second predetermined sentinel bit pattern.

10. An integrated circuit for use in a serial bus, comprising:

at least one core logic element;

a boundary scan instruction register connected to the at least one core logic element;

a test data in terminal for inputting an instruction register;

a decoder for checking for an error in the boundary scan instruction register and for outputting a signal indicating whether the error was detected; and means, responsive to the signal output from the decoder, for altering the bit pattern of the boundary scan instruction register when at least one predetermined error condition occurs, wherein the predetermined error condition is one of a condition where an error is detected by the decoder and a condition where an error is not detected by the decoder.

* * * * *